(12) United States Patent
Hirata et al.

(10) Patent No.: US 12,459,009 B2
(45) Date of Patent: Nov. 4, 2025

(54) SUBSTRATE PROCESSING APPARATUS AND SUBSTRATE PROCESSING METHOD

(71) Applicant: Tokyo Electron Limited, Tokyo (JP)

(72) Inventors: Toru Hirata, Kumamoto (JP); Yoshinori Ikeda, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 126 days.

(21) Appl. No.: 18/126,497

(22) Filed: Mar. 27, 2023

(65) Prior Publication Data
US 2023/0311170 A1 Oct. 5, 2023

(30) Foreign Application Priority Data

Mar. 29, 2022 (JP) ................. 2022-052808

(51) Int. Cl.
*B08B 3/04* (2006.01)
*B08B 13/00* (2006.01)
(52) U.S. Cl.
CPC ................ *B08B 3/04* (2013.01); *B08B 13/00* (2013.01)
(58) Field of Classification Search
CPC ...... B08B 13/00; B08B 3/04; H01L 21/67051
See application file for complete search history.

(56) References Cited

U.S. PATENT DOCUMENTS

| 2012/0260946 | A1* | 10/2012 | Ogata | H01L 21/67051 134/33 |
| 2014/0137902 | A1* | 5/2014 | Aiura | H01L 21/67051 134/104.2 |
| 2018/0025922 | A1* | 1/2018 | Tsujikawa | H01L 21/67051 134/26 |

FOREIGN PATENT DOCUMENTS

JP 2014-041994 A 3/2014

* cited by examiner

*Primary Examiner* — Douglas Lee
(74) *Attorney, Agent, or Firm* — XSENSUS LLP

(57) ABSTRACT

A substrate processing apparatus includes a substrate holding unit that holds a substrate horizontally, a processing liquid supply unit that supplies a processing liquid to the substrate, a first processing cup that is provided annularly around the substrate holding unit, a second processing cup that is provided annularly around the substrate holding unit and on an inner side of the first processing cup, a drain port that is formed on a storage unit, a first exhaust port that is provided to exhaust a gas between the first processing cup and the second processing cup, a second exhaust port that is provided on an inner side of the first exhaust port to exhaust a gas on an inner side of the second processing cup, and a suction port that is provided between the drain port and the first exhaust port in a height direction thereof.

11 Claims, 5 Drawing Sheets

… … …

SUBSTRATE PROCESSING APPARATUS AND SUBSTRATE PROCESSING METHOD

CROSS-REFERENCE TO RELATED APPLICATIONS

This application is based upon and claims the benefit of priority to Japanese Patent Application No. 2022-052808, filed on Mar. 29, 2022, the entire contents of which are herein incorporated by reference.

FIELD

The present disclosure relates to a substrate processing apparatus and a substrate processing method.

BACKGROUND

Japanese Patent Application Publication No. 2014-041994 discloses a substrate processing apparatus that separates and recovers a plurality of kinds of processing liquids by a plurality of cups.

SUMMARY

A substrate processing apparatus according to an embodiment includes a substrate holding unit that holds a substrate horizontally, a processing liquid supply unit that supplies a processing liquid to the substrate that is held horizontally by the substrate holding unit, a first processing cup that is provided annularly around the substrate holding unit, a second processing cup that is provided annularly around the substrate holding unit and is provided on an inner side of the first processing cup, a drain port that is formed on a storage unit where the processing liquid that flows between the first processing cup and the second processing cup is stored, a first exhaust port that is provided to exhaust a gas between the first processing cup and the second processing cup, a second exhaust port that is provided on an inner side of the first exhaust port and is provided to exhaust a gas on an inner side of the second processing cup, and a suction port that is provided between the drain port and the first exhaust port in a height direction thereof.

DESCRIPTION OF EMBODIMENTS

Hereinafter, an embodiment(s) of a substrate processing apparatus and a substrate processing method as disclosed in the present application will be explained in detail with reference to the accompanying drawing(s). Additionally, a substrate processing apparatus and a substrate processing method as disclosed herein are not limited by an embodiment(s) as illustrated below.

In each drawing that will be referred to below, an orthogonal coordinate system may be illustrated where a direction of an X-axis, a direction of a Y-axis, and a direction of a Z-axis that are orthogonal to one another are specified and a positive direction of such a Z-axis is provided as a vertically upward direction, for sake of clearer explanation. A direction of an X-axis and a direction of a Y-axis are horizontal directions.

Furthermore, herein, frontward and backward directions are specified where a positive direction of an x-axis is provided as a forward direction and a negative direction of such an X-axis is provided as a backward direction, and leftward and rightward directions are specified where a negative direction of a Y-axis is provided as a leftward direction and a positive direction of such a Y-axis is provided as a rightward direction. Furthermore, upward and downward directions are specified where a positive direction of a Z-axis is provided as an upward direction and a negative direction of such a Z-axis is provided as a downward direction. Furthermore, an explanation(s) will be provided herein in such a manner that an outer side in a radial direction of a wafer is provided as an "outer side" and an inner side in a radial direction of such a wafer is provided as an "inner side".

Figure 1:
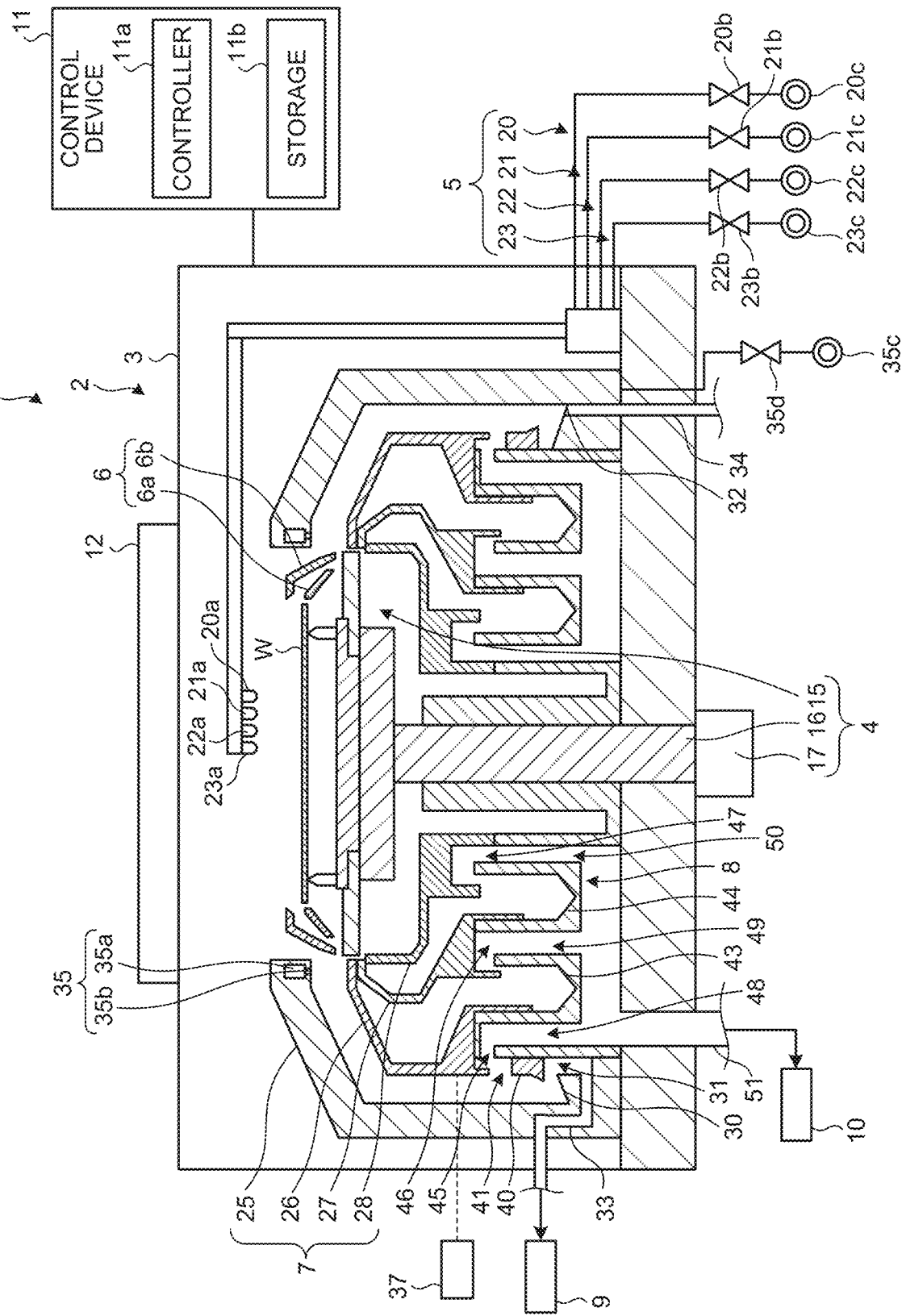
FIG. 1 is a diagram that illustrates a configuration of a processing unit of a substrate processing apparatus according to an embodiment.

A substrate processing apparatus 1 according to an embodiment will be explained with reference to FIG. 1. FIG. 1 is a diagram that illustrates a configuration of a processing unit 2 of a substrate processing apparatus 1 according to an embodiment.

In the processing unit 2, a wafer W (a substrate) with a circular shape is carried in and carried out by a (non-illustrated) transfer arm. The processing unit 2 executes processing for a wafer W by using a plurality of processing liquids.

The processing unit 2 includes a chamber 3, a substrate holding mechanism 4, a processing liquid supply unit 5, a guide cup 6, a processing cup 7, a recovery unit 8, a suction unit 9, an exhaust switching unit 10, and a control device 11.

The chamber 3 houses a part of the substrate holding mechanism 4, a part of the processing liquid supply unit 5, the guide cup 6, the processing cup 7, and the recovery unit 8. An FFU 12 (Fan Filter Unit) is provided on a ceiling part of the chamber 3. An FFU forms a downflow in the chamber 3.

The substrate holding mechanism 4 holds and rotates a wafer W. The substrate holding mechanism 4 includes a holding unit 15, a supporting unit 16, and a driving unit 17. The holding unit 15 (an example of a substrate holding unit) holds a wafer W (an example of a substrate) horizontally. The holding unit 15 includes a plurality of chuck pins that hold a wafer W. A wafer W is placed on the chuck pins. The holding unit 15 holds a wafer W by (non-illustrated) claw parts that hold a periphery thereof. The holding unit 15 includes a (non-illustrated) motor that opens and closes claw parts, etc.

The supporting unit 16 is a member that extends in a vertical direction where a proximal end part thereof is supported by the driving unit 17 so as to be rotatable and the holding unit 15 is supported horizontally on a distal end part thereof. The driving unit 17 rotates the supporting unit 16 around a vertical axis. The driving unit 17 moves a part of the holding unit 15 in upward and downward directions. The driving unit 17 includes, for example, a plurality of motors, a gear(s) that transmit(s) rotation that is generated by a motor(s), and a link mechanism, etc.

The substrate holding mechanism 4 rotates the supporting unit 16 by using the driving unit 17 so as to rotate the holding unit 15 that is supported by the supporting unit 16. Thereby, a wafer W that is held by the holding unit 15 is rotated.

The processing liquid supply unit 5 supplies a variety of liquids that are used for substrate processing to a wafer W. The processing liquid supply unit 5 supplies a processing liquid to a wafer W (an example of a substrate) that is held by the holding unit 15 (an example of a substrate holding unit). The processing liquid supply unit 5 includes a first processing liquid supply unit 20, a second processing liquid supply unit 21, a third processing liquid supply unit 22, and a rinsing liquid supply unit 23.

The first processing liquid supply unit 20 supplies a first processing liquid to a wafer W. A first processing liquid is an acidic processing liquid. An acidic processing liquid is, for example, DHF (hydrogen fluoride). A first processing liquid may be an SPM liquid (a mixed solution of sulfuric acid and an aqueous solution of hydrogen peroxide). The first processing liquid supply unit 20 includes a first supply nozzle 20a, a first regulating unit 20b, and a first processing liquid supply source 20c. The first supply nozzle 20a is connected to the first processing liquid supply source 20c through the first regulating unit 20b. The first regulating unit 20b is capable of regulating a flow rate of a first processing liquid that is discharged from the first supply nozzle 20a. The first regulating unit 20b includes a flow rate control valve and an opening/closing valve, etc.

The second processing liquid supply unit 21 supplies a second processing liquid to a wafer W. A second processing liquid is an organic processing liquid. An organic processing liquid is, for example, IPA (an isopropyl alcohol liquid). The second processing liquid supply unit 21 includes a second supply nozzle 21a, a second regulating unit 21b, and a second processing liquid supply source 21c. The second supply nozzle 21a is connected to the second processing liquid supply source 21c through the second regulating unit 21b. The second regulating unit 21b is capable of regulating a flow rate of a second processing liquid that is discharged from the second supply nozzle 21a. The second regulating unit 21b includes a flow rate control valve and an opening/closing valve, etc.

The third processing liquid supply unit 22 supplies a third processing liquid to a wafer W. A third processing liquid is an alkaline processing liquid. An alkaline processing liquid is, for example, an SC1 liquid (an aqueous solution of ammonia and hydrogen peroxide). The third processing liquid supply unit 22 includes a third supply nozzle 22a, a third regulating unit 22b, and a third processing liquid supply source 22c. The third supply nozzle 22a is connected to the third processing liquid supply source 22c through the third regulating unit 22b. The third regulating unit 22b is capable of regulating a flow rate of a third processing liquid that is discharged from the third supply nozzle 22a. The third regulating unit 22b includes a flow rate control valve and an opening/closing valve, etc. Additionally, the substrate processing apparatus 1 may include only one of the second processing liquid supply unit 21 and the third processing liquid supply unit 22.

The rinsing liquid supply unit 23 supplies a DIW (DeIonized Water: a deionized water) as a rinsing liquid to a wafer W. A DIW is provided at an ordinary temperature. A DIW includes a DIW that is provided at a different temperature. That is, the rinsing liquid supply unit 23 may be capable of supplying a DIW that is provided at a different temperature to a wafer W. The rinsing liquid supply unit 23 includes a fourth supply nozzle 23a, a fourth regulating unit 23b, and a rinsing liquid supply source 23c. The fourth supply nozzle 23a is connected to the rinsing liquid supply source 23c through the fourth regulating unit 23b. The fourth regulating unit 23b is capable of regulating a flow rate of a DIW that is discharged from the fourth supply nozzle 23a. The fourth regulating unit 23b includes a flow rate control valve and an opening/closing valve, etc.

The guide cup 6 includes a first guide cup 6a and a second guide cup 6b. The first guide cup 6a is provided on an outer side of a wafer W. The first guide cup 6a is provided annularly.

The second guide cup 6b is provided on an outer side of the first guide cup 6a. The second guide cup 6b is provided annularly. The first guide cup 6a and the second guide cup 6b are rotated together with the holding unit 15 of the substrate holding mechanism 4. The first guide cup 6a and the second guide cup 6b guide a processing liquid that scatters from a rotating wafer W, etc., and a mist of such a processing liquid, etc., to the processing cup 7. The first guide cup 6a and the second guide cup 6b have an opening on a top part thereof.

The processing cup 7 includes a first processing cup 25, a second processing cup 26, a third processing cup 27, and a fourth processing cup 28. The first processing cup 25 is provided on an outer side of the guide cup 6. The first processing cup 25 is provided annularly around the holding unit 15 (an example of a substrate holding unit). The first processing cup 25 is fixed to the chamber 3. A first storage unit 30 is formed on a bottom part of the first processing cup 25. The first storage unit 30 (an example of a storage unit) is formed annularly. The first storage unit 30 is formed along a circumferential direction of the first processing cup 25. The first storage unit 30 is formed, for example, in such a manner that a depth of an outer side thereof is greater than a depth of an inner side thereof. The first storage unit 30 stores a second processing liquid that is supplied to a wafer W. The first storage unit 30 stores a second processing liquid (an example of a processing liquid) that flows between the first processing cup 25 and the second processing cup 26.

A suction port 31 and a drain port 32 are formed on a bottom part of the first processing cup 25. The suction port 31 is formed on an inner side of the first storage unit 30. A plurality of suction ports 31 are formed. The plurality of suction ports 31 are provided along a circumferential direction of the first storage unit 30 (an example of a storage unit). The suction port 31 is provided between the drain port 32 and a first exhaust port 45 as described later in a height direction thereof. Additionally, the suction port 31 may be formed of the first processing cup 25 and an outer circumferential wall of the recovery unit 8. That is, the suction port 31 may be formed between two members that are the first processing cup 25 and the recovery unit 8. The suction port 31 is connected to a suction line 33. The suction line 33 is different from an exhaust line 51 as described later.

The drain port 32 is formed on the first storage unit 30 (an example of a storage unit). The drain port 32 is formed on an outer side of the first storage unit 30. The drain port 32 is provided on an outer side of the suction port 31. The drain port 32 is provided at a place where a depth of the first storage unit 30 is greatest. A plurality of drain ports 32 are formed. The plurality of drain ports 32 are provided along a circumferential direction of the first storage unit 30. The drain port 32 is connected to a drain line 34.

A cleaning liquid supply unit 35 is formed on the first processing cup 25. The cleaning liquid supply unit 35 supplies a cleaning liquid to an outer wall of the second processing cup 26. The cleaning liquid supply unit 35 includes a cleaning liquid flow channel 35*a* and a plurality of discharge ports 35*b*. The cleaning liquid flow channel 35*a* is formed annularly along the first processing cup 25. The plurality of discharge ports 35*b* discharge a cleaning liquid toward an upper end of the second processing cup 26. A cleaning liquid is, for example, a DIW. The plurality of discharge ports 35*b* are arranged along a circumferential direction of the first processing cup 25. A cleaning liquid is supplied from a cleaning liquid supply source 35*c* to the cleaning liquid flow channel 35*a*. A flow rate of a cleaning liquid that is supplied from the cleaning liquid supply source 35*c* is regulated by a fifth regulating unit 35*d*. The fifth regulating unit 35*d* includes a flow rate control valve and an opening/closing valve, etc.

The second processing cup 26 is provided annularly around the holding unit 15 (an example of a substrate holding unit). The second processing cup 26 is provided on an inner side of the first processing cup 25. The second processing cup 26 is provided below the first processing cup 25. The second processing cup 26 is movable in upward and downward directions. The second processing cup 26 is lifted and lowered in upward and downward directions by a lifting/lowering device 37. The lifting/lowering device 37 includes, for example, a lifting/lowering cylinder. The lifting/lowering device 37 may include a motor, etc.

The second processing cup 26 is movable between a first position and a second position. A first position is a predetermined lifting position. In a case where the second processing cup 26 is provided at a first position, the second processing cup 26 contacts the first processing cup 25. In a case where the second processing cup 26 is provided at a first position, an upper end of the second processing cup 26 contacts the first processing cup 25. Specifically, the second processing cup 26 contacts the first processing cup 25 in such a manner that a processing liquid, etc., does/do not flow between the first processing cup 25 and the second processing cup 26.

A second position is a predetermined lowering position. In a case where the second processing cup 26 is provided at a second position, the second processing cup 26 does not contact the first processing cup 25 and contacts the third processing cup 27. In a case where the second processing cup 26 is provided at a second position, the second processing cup 26 contacts the third processing cup 27 in such a manner that a processing liquid, etc., does/do not flow between the second processing cup 26 and the third processing cup 27.

The second processing cup 26 includes a sealing member 40 and a communication port 41. The sealing member 40 is provided on a side of a lower end of the second processing cup 26. The sealing member 40 is lifted and lowered depending on lifting and lowering of the second processing cup 26. The sealing member 40 is moved by the lifting/lowering device 37 (an example of a movement device). The sealing member 40 opens or closes a first exhaust port 45 as described later. The communication port 41 is provided, for example, above the sealing member 40. The communication port 41 is provided so as to be communicable with the first exhaust port 45. The sealing member 40 and the communication port 41 are provided at places that correspond to the first exhaust port 45. An outer wall of the sealing member 40 on a side of a lower end thereof protrudes toward an outer side thereof. The sealing member 40 guides a second processing liquid that flows between the first processing cup 25 and the second processing cup 26 to an outer side thereof. The sealing member 40 guides a second processing liquid in such a manner that such a second processing liquid does not flow into the suction port 31.

The third processing cup 27 is provided annularly around the holding unit 15. The third processing cup 27 is provided on an inner side of the second processing cup 26. The third processing cup 27 is lifted and lowered in upward and downward directions by a (non-illustrated) lifting/lowering device. A lifting/lowering device includes, for example, a lifting/lowering cylinder. A lifting/lowering device may include a motor, etc.

The third processing cup 27 is movable to a third position and a fourth position by a lifting/lowering device. A third position is a predetermined lowering position. In a case where the third processing cup 27 is provided at a third position, the third processing cup 27 contacts the fourth processing cup 28. A fourth position is a predetermined lifting position. In a case where the third processing cup 27 is provided at a fourth position, the third processing cup 27 contacts the second processing cup 26 and does not contact the fourth processing cup 28. Additionally, in a case where the third processing cup 27 is provided at a fourth position, the second processing cup 26 is provided at a first position.

The fourth processing cup 28 is connected to the recovery unit 8. The fourth processing cup 28 is fixed to the chamber 3 through the recovery unit 8.

The recovery unit 8 is provided on a lower side of the second processing cup 26 and the third processing cup 27. The recovery unit 8 is formed annularly around the supporting unit 16. The recovery unit 8 is provided on an inner side of the first processing cup 25. A second storage unit 43 and a third storage unit 44 are formed on the recovery unit 8.

The second storage unit 43 is provided on an inner side of the first storage unit 30. The second storage unit 43 is formed annularly. The second storage unit 43 is formed along a circumferential direction of the second processing cup 26 and the third processing cup 27. A (non-illustrated) discharge port that discharges a processing liquid, etc., that is/are stored in the second storage unit 43 is formed on a bottom part of the second storage unit 43.

The third storage unit 44 is provided on an inner side of the second storage unit 43. The third storage unit 44 is formed annularly. The third storage unit 44 is formed along a circumferential direction of the third processing cup 27 and the fourth processing cup 28. A (non-illustrated) discharge port that discharges a processing liquid, etc., that is/are stored in the third storage unit 44 is formed on a bottom part of the third storage unit 44.

A first exhaust port 45, a second exhaust port 46, a third exhaust port 47, a first exhaust route 48, a second exhaust route 49, and a third exhaust route 50 are formed on the recovery unit 8.

The first exhaust port 45 is formed on an outer circumferential wall of the recovery unit 8. The first exhaust port 45 is provided below the second processing cup 26. The first exhaust port 45 is provided so as to exhaust a gas between the first processing cup 25 and the second processing cup 26. A plurality of first exhaust ports 45 are provided along a circumferential direction of the recovery unit 8. The first exhaust port 45 is communicated with the first exhaust route 48. The first exhaust route 48 is provided on an outer side of the second storage unit 43.

The second exhaust port 46 is provided on an inner side of the first exhaust port 45. The second exhaust port 46 is provided in an area that is isolated from the first exhaust port 45. The second exhaust port 46 is provided so as to exhaust a gas on an inner side of the second processing cup 26. The second exhaust port 46 is provided so as to exhaust a gas between the second processing cup 26 and the third processing cup 27. A plurality of second exhaust ports 46 are provided along a circumferential direction of the recovery unit 8. The second exhaust port 46 is communicated with the second exhaust route 49. The second exhaust route 49 is provided on an inner side of the second storage unit 43 and an outer side of the third storage unit 44.

The third exhaust port 47 is provided on an inner side of the second exhaust port 46. The third exhaust port 47 is provided in an area that is isolated from the first exhaust port 45 and the second exhaust port 46. The third exhaust port 47 is provided so as to exhaust a gas between the third processing cup 27 and the fourth processing cup 28. A plurality of third exhaust ports 47 are provided along a circumferential direction of the recovery unit 8. The third exhaust port 47 is communicated with the third exhaust route 50. The third exhaust route 50 is provided on an inner side of the third storage unit 44.

The first exhaust route 48, the second exhaust route 49, and the third exhaust route 50 are joined on a side of a lower end of the recovery unit 8 and are connected to the exhaust line 51. That is, the first exhaust port 45, the second exhaust port 46, and the third exhaust port 47 are commonly connected to the exhaust line 51.

The suction unit 9 is provided on the suction line 33 that is connected to the suction port 31. The suction unit 9 suctions a gas between the first processing cup 25 and the second processing cup 26 from the suction port 31. The suction unit 9 is, for example, an ejector. The suction unit 9 may be a suction pump, etc.

Figure 2:
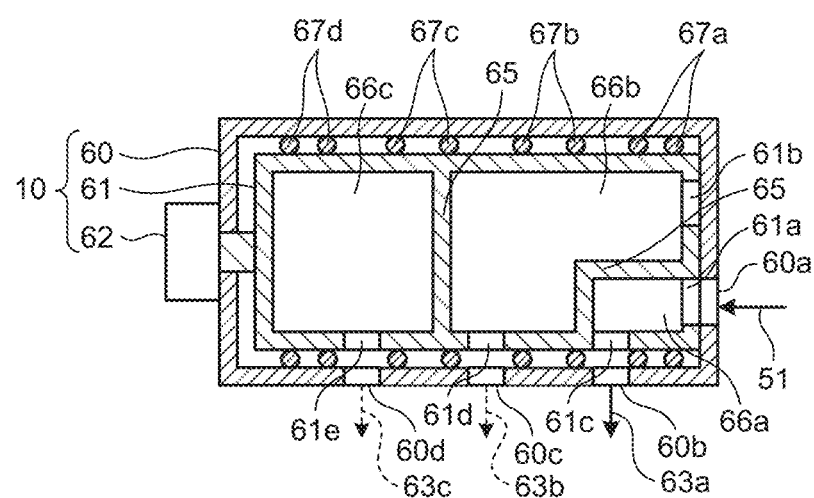
FIG. 2 is a diagram that illustrates a configuration of an exhaust switching unit according to an embodiment.

An exhaust switching unit 10 will be explained with reference to FIG. 2. FIG. 2 is a diagram that illustrates a configuration of an exhaust switching unit 10 according to an embodiment. The exhaust switching unit 10 includes an external unit 60, an internal unit 61, and a driving unit 62. The external unit 60 has a cylindrical shape. An inflow port 60a, a first discharge port 60b, a second discharge port 60c, and a third discharge port 60d are formed on the external unit 60. The inflow port 60a is formed on one end surface thereof in an axial direction thereof. The external unit 60 is connected to an exhaust line 51. Specifically, the inflow port 60a of the external unit 60 is connected to the exhaust line 51.

The first discharge port 60b, the second discharge port 60c, and the third discharge port 60d are formed on an outer circumferential wall of the external unit 60. The first discharge port 60b, the second discharge port 60c, and the third discharge port 60d are arranged side by side along an axial direction of the exhaust switching unit 10.

The first discharge port 60b, the second discharge port 60c, and the third discharge port 60d are connected to a plurality of separate exhaust lines 63a to 63c. The first discharge port 60b is connected to a first separate exhaust line 63a. The second discharge port 60c is connected to a second separate exhaust line 63b. The third discharge port 60d is connected to a third separate exhaust line 63c. The exhaust line 51 is connected to the plurality of separate exhaust lines 63a to 63c through the exhaust switching unit 10.

The internal unit 61 has a cylindrical shape. The internal unit 61 is housed in the external unit 60. The internal unit 61 is rotated relative to the external unit 60 by the driving unit 62. The internal unit 61 is rotated relative to the external unit 60 so as to switch a state of communication between the exhaust line 51 and the plurality of separate exhaust lines 63a to 63c. A first inflow port 61a, a second inflow port 61b, a (non-illustrated) third inflow port, a fourth discharge port 61c, a fifth discharge port 61d, and a sixth discharge port 61e are formed on the internal unit 61.

The first inflow port 61a, the second inflow port 61b, and the third inflow port are formed on one end surface thereof in an axial direction thereof. The first inflow port 61a, the second inflow port 61b, and the third inflow port are formed on a surface that faces an end surface of the external unit 60 where the inflow port 60a is formed. The first inflow port 61a, the second inflow port 61b, and the third inflow port are arranged side by side along a circumferential direction of the internal unit 61. The internal unit 61 is rotated so as to switch a state of communication of the first inflow port 61a, the second inflow port 61b, and the third inflow port with the inflow port 60a of the external unit 60. That is, the internal unit 61 includes a plurality of inflow ports 61a, 61b where a state of communication with the exhaust line 51 is switched depending on a rotational position thereof.

The fourth discharge port 61c, the fifth discharge port 61d, and the sixth discharge port 61e are formed on an outer circumferential wall of the internal unit 61. The fourth discharge port 61c, the fifth discharge port 61d, and the sixth discharge port 61e are arranged along an axial direction of the exhaust switching unit 10. The fourth discharge port 61c is formed so as to be communicated with the first discharge port 60b of the external unit 60. The fifth discharge port 61d is formed so as to be communicated with the second discharge port 60c of the external unit 60. The sixth discharge port 61e is formed so as to be communicated with the third discharge port 60d of the external unit 60.

The internal unit 61 includes a partition wall 65. The partition wall 65 partitions an inside of the internal unit 61 into a plurality of chambers 66a to 66c that are dependent on the plurality of inflow ports 61a, 61b. The partition wall 65 partitions an inside of the internal unit 61 into a first chamber 66a, a second chamber 66b, and a third chamber 66c. The first chamber 66a is communicated with the first inflow port 61a and the fourth discharge port 61c. The second chamber 66b is communicated with the second inflow port 61b and the fifth discharge port 61d. The third chamber 66c is communicated with the third inflow port and the sixth discharge port 61e.

A plurality of pairs of seal members 67a to 67d are provided between the external unit 60 and the internal unit 61. Respective pairs of seal members 67a to 67d are provided along an outer circumferential wall of the internal unit 61. The pairs of seal members 67a to 67d are, for example, lip seals. The pairs of seal members 67a to 67d are provided in such a manner that a gas that is discharged from respective discharge ports 61c to 61e does not flow into another/other discharge port(s) 61c to 61e. Seal purging is executed for the pairs of seal members 67a to 67d. For example, air is injected between a pair of seal members 67a so as to improve a sealing property thereof.

Additionally, A seal member is provided around the first inflow port 61a, the second inflow port 61b, and the third inflow port in such a manner that a gas that flows therein from the inflow port 60a of the external unit 60 does not flow into a plurality of inflow ports 60a among the first inflow port 61a, the second inflow port 61b, and the third inflow port.

The driving unit 62 rotates the internal unit 61. The driving unit 62 includes, for example, a motor and a shaft that transmits rotation of such a motor. The driving unit 62 includes a deceleration mechanism that decelerates rotation of a motor.

In a case where an organic gas (an organic atmosphere) is exhausted through the exhaust line 51, the driving unit 62 executes rotation in such a manner that the first inflow port 61a of the internal unit 61 is communicated with the inflow port 60a of the external unit 60. That is, in a case where an organic gas is exhausted through the exhaust line 51, the internal unit 61 is rotated in such a manner that such an organic gas flows through the first separate exhaust line 63a.

In a case where an acidic gas (an acidic atmosphere) is exhausted through the exhaust line 51, the driving unit 62 rotates the internal unit 61 in such a manner that the second inflow port 61b of the internal unit 61 is communicated with the inflow port 60a of the external unit 60. That is, in a case where an acidic gas is exhausted through the exhaust line 51, the internal unit 61 is rotated in such a manner that such an acidic gas flows through the second separate exhaust line 63b.

In a case where an alkaline gas (an alkaline atmosphere) is exhausted through the exhaust line 51, the driving unit 62 rotates the internal unit 61 in such a manner that the third inflow port of the internal unit 61 is communicated with the inflow port 60a of the external unit 60. That is, in a case where an alkaline gas is exhausted through the exhaust line 51, the internal unit 61 is rotated in such a manner that such an alkaline gas flows through the third separate exhaust line 63c.

By returning to FIG. 1, the control device 11 is, for example, a computer and includes a controller 11a and a storage 11b. A program that controls a variety of processes that are executed in the substrate processing apparatus 1 is stored in the storage 11b. The controller 11a reads and executes a program that is stored in the storage 11b so as to control an operation of the substrate processing apparatus 1. The controller 11a executes each process in the processing unit 2. The controller 11a controls a transfer arm so as to transfer a wafer W. The controller 11a controls the suction unit 9, the driving unit 17, the lifting/lowering device 37, and the driving unit 62, etc.

Additionally, such a program may be recorded in a computer-readable storage medium and be installed in the storage 11b of the control device 11 from such a storage medium. For a computer-readable storage medium, for example, a hard disk (HD), a flexible disk (FD), a compact disk (CD), a magneto-optical disk (MO), a memory card, etc., are provided.

Next, processing for a wafer W in a processing unit 2 according to an embodiment will be explained. Herein, an example where a first process and a second process are executed for a wafer W will be explained as processing for a wafer W in the processing unit 2. In the first process, a first processing liquid, for example, DHF is supplied to a wafer W so as to execute processing. In the second process, a second processing liquid, for example, IPA is supplied to a wafer W so as to execute processing.

Figure 3:
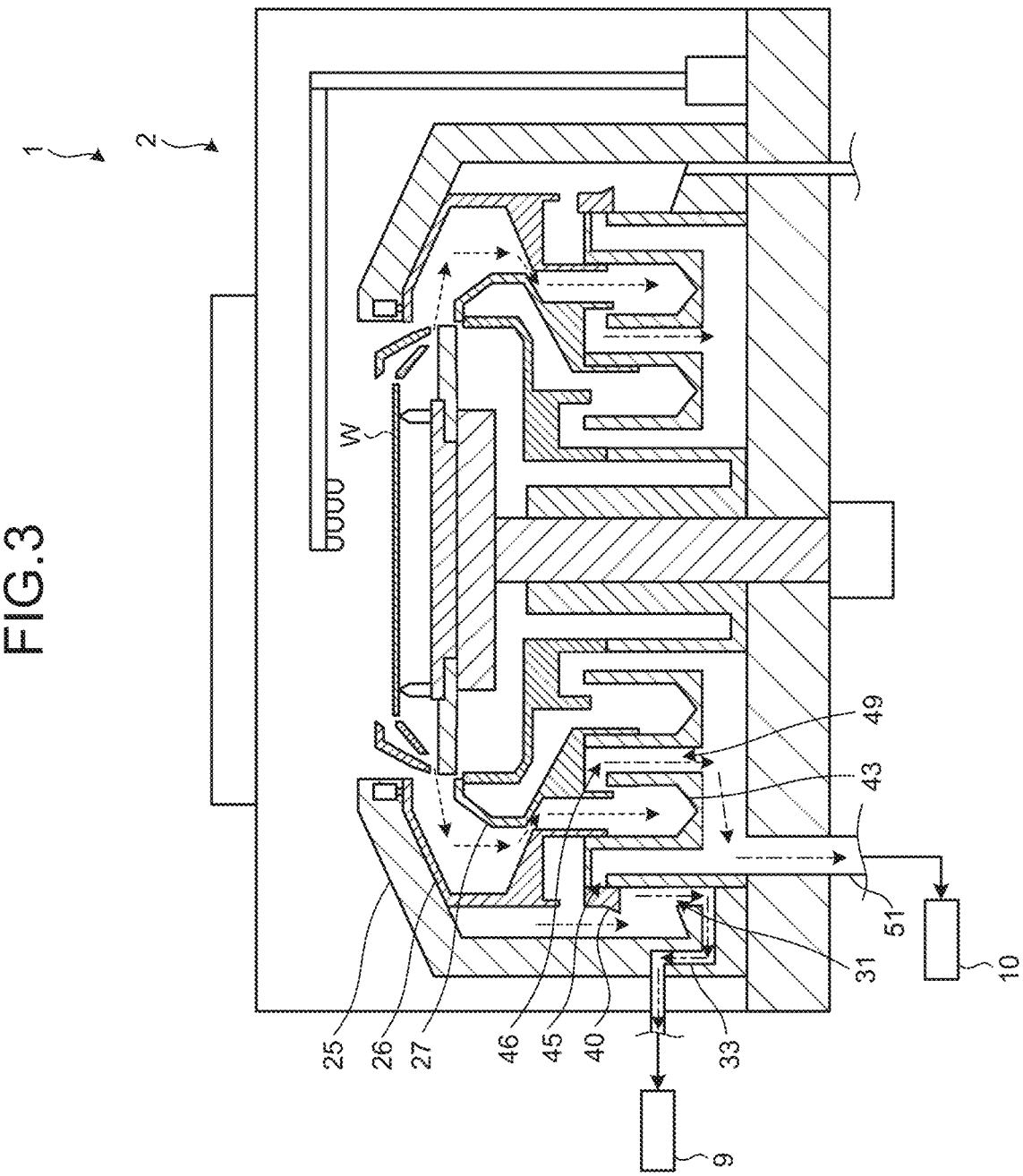
FIG. 3 is a diagram that illustrates a state where a first process is executed in a processing unit according to an embodiment.

In the first process, after a first processing liquid is supplied to a wafer W, a DIW is supplied to such a wafer W. In the first process, a first processing liquid and a DIW are supplied to a wafer W in a state where such a wafer W is rotated. In the first process, a second processing cup 26 is provided at a first position, as illustrated in FIG. 3. Additionally, a third processing cup 27 is provided at a third position. FIG. 3 is a diagram that illustrates a state where a first process is executed in a processing unit 2 according to an embodiment.

In the first process, a first processing liquid and a DIW that are supplied to a wafer W flow between a second processing cup 26 and a third processing cup 27 so as to be stored in a second storage unit 43, as indicated by an arrow of a broken line. Additionally, a first processing liquid and a DIW that are stored in the second storage unit 43 are discharged from a (non-illustrated) discharge port that is connected to the second storage unit 43. The second processing cup 26 is configured in such a manner that a first processing liquid that is supplied to a wafer W (an example of a substrate) flows in an inner side of the second processing cup 26, at a first position.

In the first process, a gas between the second processing cup 26 and the third processing cup 27 is exhausted from a second exhaust port 46 to an exhaust switching unit 10 through a second exhaust route 49 and an exhaust line 51, as indicated by an arrow of a dashed-dotted line. In the exhaust switching unit 10, an internal unit 61 (see FIG. 2) is rotated in such a manner that a second inflow port 61b (see FIG. 2) of the internal unit 61 is communicated with an inflow port 60a (see FIG. 2) of an external unit 60 (see FIG. 2). A gas that is exhausted through the exhaust line 51 is exhausted from a second chamber 66b (see FIG. 2) to a second separate exhaust line 63b (see FIG. 2) through a fifth discharge port 61d (see FIG. 2) of the internal unit 61 and a second discharge port 60c (see FIG. 2) of the external unit 60.

In the first process, the second processing cup 26 is provided at a first position, so that none of a first processing liquid and a DIW flows between a first processing cup 25 and the second processing cup 26. Furthermore, the second processing cup 26 is provided at a first position, so that a first exhaust port 45 is closed by a sealing member 40 of the second processing cup 26. That is, a first position is also a position where the first exhaust port 45 is closed by the sealing member 40. The first exhaust port 45 is closed by the sealing member 40 so as to reduce or prevent exhausting of a gas between the first processing cup 25 and the second processing cup 26 through the exhaust line 51.

In the first process, a gas between the first processing cup 25 and the second processing cup 26 is exhausted from a suction port 31 through a suction line 33 by a suction unit 9, as indicated by an arrow of a dashed-two dotted line.

Figure 4:
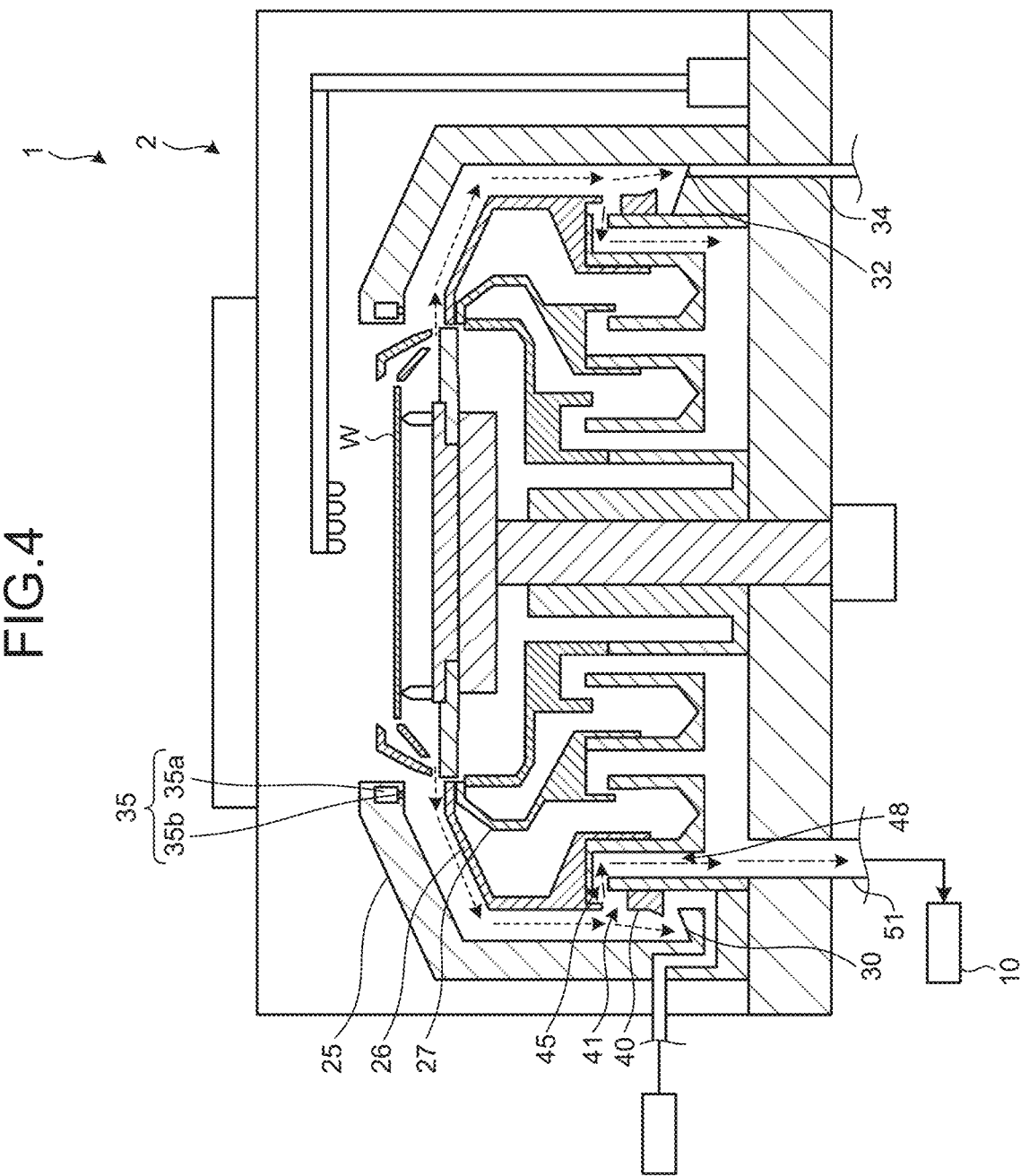
FIG. 4 is a diagram that illustrates a state where a second process is executed in a processing unit according to an embodiment.

In a second process, after a second processing liquid is supplied to a wafer W, such a wafer W is rotated in a state where supply of such a second processing liquid is stopped, so that such a wafer W is dried. In the second process, a second processing liquid is supplied to a wafer W in a state where such a wafer W is rotated. In the second process, a second processing cup 26 is provided at a second position, as illustrated in FIG. 4. Additionally, a third processing cup 27 is provided at a third position. FIG. 4 is a diagram that illustrates a state where a second process is executed in a processing unit 2 according to an embodiment.

In the second process, a second processing liquid and a DIW that are supplied to a wafer W flow between a first processing cup 25 and a second processing cup 26 so as to be stored in a first storage unit 30, as indicated by an arrow of a broken line. That is, the second processing cup 26 is configured in such a manner that a second processing liquid that is supplied to a wafer W (an example of a substrate) flows between the first processing cup 25 and the second processing cup 26, at a second position. Additionally, a second processing liquid and a DIW that are stored in the first storage unit 30 are discharged from a drain port 32 and through a drain line 34.

The second processing cup 26 is provided at a second position, so that a first exhaust port 45 is not closed by a sealing member 40 of the second processing cup 26 and is opened. Specifically, the second processing cup 26 is provided at a second position, so that a first exhaust port 45 is communicated with a communication port 41. That is, a second position is a position where the first exhaust port 45 is communicated with the communication port 41. In the second process, a gas between the first processing cup 25 and the second processing cup 26 flows from the first exhaust port 45 into an exhaust switching unit 10 through a first exhaust route 48 and an exhaust line 51, as indicated by an arrow of a dashed-dotted line. In the exhaust switching unit 10, an internal unit 61 is rotated in such a manner that a first inflow port 61a (see FIG. 2) of the internal unit 61 is communicated with an inflow port 60a (see FIG. 2) of an external unit 60. A gas that is exhausted through the exhaust line 51 is exhausted from a first chamber 66a (see FIG. 2) to a first separate exhaust line 63a (see FIG. 2) through a fourth discharge port 61c (see FIG. 2) of the internal unit 61 and a first discharge port 60b (see FIG. 2) of the external unit 60.

In the second process, suction is not executed by a suction unit 9, so that a gas between the first processing cup 25 and the second processing cup 26 is not exhausted from a suction port 31 through a suction line 33. Additionally, in the second process, suction may be executed by the suction unit 9, so that a gas between the first processing cup 25 and the second processing cup 26 may be exhausted from the suction port 31 through the suction line 33.

In the second process, the second processing cup 26 is provided at a second position, so that none of a second processing liquid and a DIW flows between the second processing cup 26 and a third processing cup 27.

Furthermore, in the second process, a cleaning liquid is discharged from a discharge port 35b of a cleaning liquid supply unit 35 toward an upper end of the second processing cup 26. A cleaning liquid that is discharged to an upper end of the second processing cup 26 flows along an outer wall of the second processing cup 26 so as to clean such an outer wall of the second processing cup 26. A cleaning liquid causes a second processing liquid that is attached to an outer wall of the second processing cup 26 and a second processing liquid that has been attached to such an outer wall of the second processing cup 26 to flow to the first storage unit 30.

Figure 5:
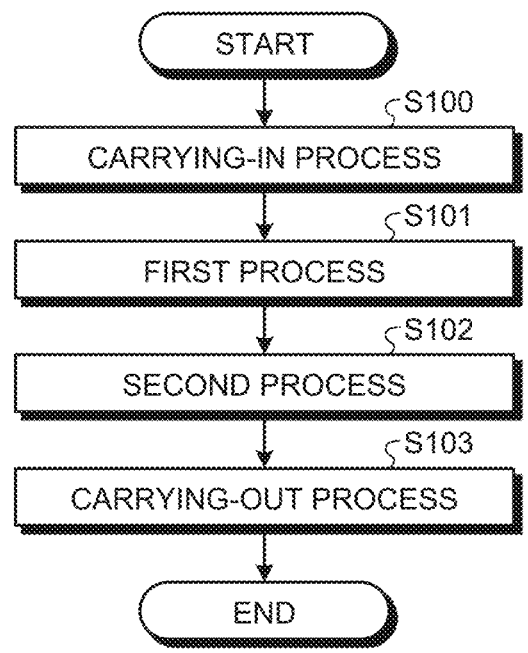
FIG. 5 is a flowchart that explains wafer processing according to an embodiment.

Next, processing for a wafer W according to an embodiment will be explained with reference to FIG. 5. FIG. 5 is a flowchart that explains wafer processing according to an embodiment.

A controller 11a executes a carrying-in process (S100). The controller 11a transfers a wafer W to a chamber 3 by a transfer arm. A wafer W that is transferred by the chamber 3 is held horizontally by a holding unit 15 of a substrate holding mechanism 4.

The controller 11a executes a first process (S101). The controller 11a provides a second processing cup 26 at a first position. Additionally, the second processing cup 26 may be provided at a first position in a carrying-in process. The controller 11a rotates a wafer W in a state where such a wafer W is held horizontally by the holding unit 15 of the substrate holding mechanism 4. The controller 11a supplies a first processing liquid to a wafer W. The controller 11a supplies a first processing liquid to a wafer W, and subsequently, stops supply of such a first processing liquid and supplies a DIW thereto.

The second processing cup 26 is provided at a first position, so that a first exhaust port 45 of a recovery unit 8 is closed by a sealing member 40. The controller 11a controls a lifting/lowering device 37 (an example of a movement device) in such a manner that the sealing member 40 closes the first exhaust port 45, in a case where a first processing liquid (an example of a processing liquid) flows to an inner side of the second processing cup 26.

Furthermore, the controller 11a rotates an internal unit 61 in such a manner that an inflow port 60a of an external unit 60 is communicated with a second inflow port 61b of the internal unit 61, in an exhaust switching unit 10. Thereby, a gas between the second processing cup 26 and a third processing cup 27 is exhausted to a second separate exhaust line 63b through a second exhaust port 46, a second exhaust route 49, an exhaust line 51, and the exhaust switching unit 10.

Furthermore, the controller 11a suctions a gas between a first processing cup 25 and the second processing cup 26 by a suction unit 9. The controller 11a controls the suction unit 9 so as to execute exhausting from a suction port 31 in a case where a first processing liquid (an example of a processing liquid) flows to an inner side of the second processing cup 26. A gas between the first processing cup 25 and the second processing cup 26 is suctioned by the suction unit 9, so as to reduce or prevent flowing of such a gas between the first processing cup 25 and the second processing cup 26 to a side of the first exhaust port 45.

The controller 11a executes a second process (S102). The controller 11a provides the second processing cup 26 at a second position. The controller 11a rotates a wafer W so as to supply a second processing liquid to such a wafer W. The controller 11a supplies a second processing liquid to a wafer W, and subsequently, stops supply of such a second processing liquid thereto and rotates such a wafer W so as to dry it.

The second processing cup 26 is provided at a second position, so that the first exhaust port 45 of the recovery unit 8 is communicated with a communication port 41. Furthermore, the controller 11a rotates the internal unit 61 in such a manner that the inflow port 60a of the external unit 60 is communicated with a first inflow port 61a of the internal unit 61, in the exhaust switching unit 10. Thereby, a gas between the first processing cup 25 and the second processing cup 26 is exhausted to a first separate exhaust line 63a through the communication port 41, the first exhaust port 45, a first exhaust route 48, the exhaust line 51, and the exhaust switching unit 10.

The controller 11a discharges a cleaning liquid toward an upper end of the second processing cup 26 by a cleaning liquid supply unit 35 in the second process. The controller 11a controls the cleaning liquid supply unit 35 so as to discharge a cleaning liquid in a case where a second processing liquid (an example of a processing liquid) flows between the first processing cup 25 and the second processing cup 26. Thereby, a second processing liquid that is attached to an outer wall of the second processing cup 26 and a second processing liquid that has been attached to such an outer wall of the second processing cup 26 are removed.

The controller 11a executes a carrying-out process (S103). The controller 11a carries a wafer W out of the chamber 3 by a transfer arm.

A substrate processing apparatus 1 includes a holding unit 15 (an example of a substrate holding unit), a processing liquid supply unit 5, a first processing cup 25, a second processing cup 26, a drain port 32, a first exhaust port 45, a second exhaust port 46, and a suction port 31. The holding unit 15 holds a wafer W (an example of a substrate) horizontally. The processing liquid supply unit 5 supplies a processing liquid to a wafer W that is held horizontally by the holding unit 15. The first processing cup 25 is provided annularly around the holding unit 15. The second processing cup 26 is provided annularly around the holding unit 15 and is provided on an inner side of the first processing cup 25. The drain port 32 is formed on a first storage unit 30 (an example of a storage unit) where a second processing liquid (an example of a processing liquid) that flows between the first processing cup 25 and the second processing cup 26 is stored. The first exhaust port 45 is provided so as to exhaust a gas between the first processing cup 25 and the second processing cup 26. The second exhaust port 46 is provided on an inner side of the first exhaust port 45 and is provided so as to exhaust a gas on an inner side of the second processing cup 26. The suction port 31 is provided between the drain port 32 and the first exhaust port 45 in a height direction thereof.

Thereby, it is possible for the substrate processing apparatus 1 to exhaust a gas between the first processing cup 25 and the second processing cup 26 through the suction port 31. Hence, it is possible for the substrate processing apparatus 1 to reduce or prevent flowing of a gas between the first processing cup 25 and the second processing cup 26 into the second exhaust port 46 in a case where exhausting is executed from the second exhaust port 46. Therefore, it is possible for the substrate processing apparatus 1 to reduce or prevent incorporating of a component(s) of a plurality of processing liquids into a gas that is exhausted in a case where processing is executed for a wafer W by using such a plurality of processing liquids.

The first exhaust port 45 and the second exhaust port 46 are commonly connected to an exhaust line 51. The suction port 31 is connected to a suction line 33 that is different from the exhaust line 51.

Thereby, it is possible for the substrate processing apparatus 1 to prevent a gas that is exhausted through the suction port 31 from incorporating into the exhaust line 51.

The first storage unit 30 (an example of a storage unit) is formed annularly. A plurality of suction ports 31 are provided along a circumferential direction of the first storage unit 30.

Thereby, it is possible for the substrate processing apparatus 1 to exhaust a gas between the first processing cup 25 and the second processing cup 26 from the plurality of suction ports 31. Hence, it is possible for the substrate processing apparatus 1 to reduce or prevent a gas that is left between the first processing cup 25 and the second processing cup 26.

The substrate processing apparatus 1 includes a sealing member 40. The sealing member 40 opens or closes the first exhaust port 45.

Thereby, it is possible for the substrate processing apparatus 1 to open the first exhaust port 45 by the sealing member 40 so as to exhaust a gas from between the first processing cup 25 and the second processing cup 26 through the first exhaust port 45 to the exhaust line 51. It is possible for the substrate processing apparatus 1 to reduce or prevent incorporating of a gas between the first processing cup 25 and the second processing cup 26 into a gas that is exhausted through the second exhaust port 46 in a case where exhausting is executed from an inner side of the second processing cup 26 through the second exhaust port 46.

The first exhaust port 45 is provided below the second processing cup 26. The second processing cup 26 includes a sealing member 40 and a communication port 41. The communication port 41 is communicable with the first exhaust port 45. The second processing cup 26 is movable between a first position and a second position. A first position is a position where the first exhaust port 45 is closed by the sealing member 40. A second position is a position where the first exhaust port 45 is communicated with the communication port 41.

Thereby, it is possible for the substrate processing apparatus 1 to switch the second processing cup 26 between a first position and a second position so as to switch a state of communication between the first exhaust port 45 and the exhaust line 51. It is possible for the substrate processing apparatus 1 to open or close the first exhaust port 45 according to movement of the second processing cup 26.

The second processing cup 26 is movable in upward and downward directions. The second processing cup 26 is configured in such a manner that a first processing liquid that is supplied to a wafer W (an example of a substrate) flows to an inner side of the second processing cup 26, at a first position. The second processing cup 26 is configured in such a manner that a second processing liquid that is supplied to a wafer W flows between the first processing cup 25 and the second processing cup 26, at a second position that is a position below a first position.

Thereby, it is possible for the substrate processing apparatus 1 to move the second processing cup 26 in upward and downward directions so as to switch a discharging destination for a first processing liquid and a second processing liquid.

The exhaust line 51 is connected to a plurality of separate exhaust lines 63a to 63c through the exhaust switching unit 10. The exhaust switching unit 10 includes an external unit 60 and an internal unit 61. The external unit 60 is connected to the exhaust line 51. The internal unit 61 is housed in the external unit 60 and is rotated relative to the external unit 60 so as to switch a state of communication between the exhaust line 51 and the plurality of separate exhaust lines 63a to 63c. The internal unit 61 includes a plurality of inflow ports 60a, 61b and a partition wall 65. A state of communication of the plurality of inflow ports 60a, 61b with the exhaust line 51 is switched depending on a rotational position thereof. The partition wall 65 partitions an inside of the internal unit 61 into a plurality of chambers 66a to 66c that are dependent on the plurality of inflow ports 60a, 61b.

Thereby, it is possible for the substrate processing apparatus 1 to separate and exhaust gases that are exhausted to the separate exhaust lines 63a to 63c depending on kinds thereof.

The substrate processing apparatus 1 includes a cleaning liquid supply unit 35. The cleaning liquid supply unit 35 is formed on the first processing cup 25 and supplies a cleaning liquid to an outer wall of the second processing cup 26. The cleaning liquid supply unit 35 includes a plurality of discharge ports 35b. The plurality of discharge ports 35b discharges a cleaning liquid toward an upper end of the second processing cup 26. The plurality of discharge ports 35b are arranged along a circumferential direction of the second processing cup 26.

Thereby, it is possible for the substrate processing apparatus 1 to reduce or prevent attachment of a processing liquid to an outer wall of the second processing cup 26. Furthermore, it is possible for the substrate processing apparatus 1 to clean an outer wall of the second processing cup 26 where a processing liquid is attached thereto with a cleaning liquid. Hence, it is possible for the substrate processing apparatus 1 to reduce, for example, a processing liquid that is included in a gas between the first processing cup 25 and the second processing cup 26.

A processing unit 2 according to a variation may be capable of discharging a DIW toward a back surface of a wafer W. For example, the processing unit 2 may discharge a DIW to a back surface of a wafer W so as to clean such a back surface of a wafer W, in a second process.

A processing unit 2 according to a variation may provide a first exhaust port 45 and a sealing member 40 on a first processing cup 25. Furthermore, a processing unit 2 according to a variation may provide a suction port 31 on an outer side of a first storage unit 30.

An embodiment provides a technique that reduces or prevents incorporating of gases of a plurality of kinds of processing liquids into a gas that is exhausted.

A substrate processing apparatus according to an aspect of an embodiment includes a substrate holding unit, a processing liquid supply unit, a first processing cup, a second processing cup, a drain port, a first exhaust port, a second exhaust port, and a suction port. The substrate holding unit holds a substrate horizontally. The processing liquid supply unit supplies a processing liquid to the substrate that is held horizontally by the substrate holding unit. The first processing cup is provided annularly around the substrate holding unit. The second processing cup is provided annularly around the substrate holding unit and is provided on an inner side of the first processing cup. The drain port is formed on a storage unit where the processing liquid that flows between the first processing cup and the second processing cup is stored. The first exhaust port is provided so as to exhaust a gas between the first processing cup and the second processing cup. The second exhaust port is provided on an inner side of the first exhaust port and is provided so as to exhaust a gas on an inner side of the second processing cup. The suction port is provided between the drain port and the first exhaust port in a height direction thereof.

According to an embodiment, it is possible to reduce or prevent incorporating of gases of a plurality of kinds of processing liquids into a gas that is exhausted.

Appendix (1): A substrate processing apparatus, including a substrate holding unit that holds a substrate horizontally, a processing liquid supply unit that supplies a processing liquid to the substrate that is held horizontally by the substrate holding unit, a first processing cup that is provided annularly around the substrate holding unit, a second processing cup that is provided annularly around the substrate holding unit and is provided on an inner side of the first processing cup, a drain port that is formed on a storage unit where the processing liquid that flows between the first processing cup and the second processing cup is stored, a first exhaust port that is provided so as to exhaust a gas between the first processing cup and the second processing cup, a second exhaust port that is provided on an inner side of the first exhaust port and is provided so as to exhaust a gas on an inner side of the second processing cup, and a suction port that is provided between the drain port and the first exhaust port in a height direction thereof.

Appendix (2): The substrate processing apparatus according to Appendix (1), wherein the first exhaust port and the second exhaust port are commonly connected to an exhaust line, and the suction port is connected to a suction line that is different from the exhaust line.

Appendix (3): The substrate processing apparatus according to Appendix (1) or (2), wherein the storage unit is formed annularly, and a plurality of the suction ports are provided along a circumferential direction of the storage unit.

Appendix (4): The substrate processing apparatus according to any one of Appendices (1) to (3), including a sealing member that opens or closes the first exhaust port.

Appendix (5): The substrate processing apparatus according to Appendix (4), wherein the first exhaust port is provided below the second processing cup, the second processing cup includes the sealing member, and a communication port that is communicable with the first exhaust port, and the second processing cup is movable between a first position where the sealing member closes the first exhaust port and a second position where the first exhaust port is communicated with the communication port.

Appendix (6): The substrate processing apparatus according to Appendix (5), wherein the second processing cup is movable in upward and downward directions, and the second processing cup is configured in such a manner that a first processing liquid that is supplied to the substrate flows to an inner side of the second processing cup at the first position and a second processing liquid that is supplied to the substrate flows between the first processing cup and the second processing cup at the second position that is a position below the first position.

Appendix (7): The substrate processing apparatus according to any one of Appendices (1) to (6), wherein the first exhaust port and the second exhaust port are commonly connected to an exhaust line, the exhaust line is connected to a plurality of separate exhaust lines through an exhaust switching unit, the exhaust switching unit includes an external unit that is connected to the exhaust line, and an internal unit that is housed in the external unit, and is rotated relative to the external unit so as to switch a state of communication between the exhaust line and the plurality of separate exhaust lines, and the internal unit includes a plurality of inflow ports that switch a state of communication with the exhaust line depending on a rotational position thereof, and a partition wall that partitions an inside of the internal unit into a plurality of chambers that are dependent on the plurality of inflow ports.

Appendix (8): The substrate processing apparatus according to any one of Appendices (1) to (7), including a cleaning liquid supply unit that is formed on the first processing cup and supplies a cleaning liquid to an outer wall of the second processing cup, wherein the cleaning liquid supply unit includes a plurality of discharge ports that discharge the cleaning liquid toward an upper end of the second processing cup, and the plurality of discharge ports are arranged along a circumferential direction of the first processing cup.

Appendix (9): A substrate processing apparatus, including a substrate holding unit that holds a substrate horizontally, a processing liquid supply unit that supplies a processing liquid to the substrate that is held by the substrate holding unit, a first processing cup that is provided annularly around the substrate holding unit, a second processing cup that is provided annularly around the substrate holding unit and is provided on an inner side of the first processing cup, a drain port that is formed on a storage unit where the processing liquid that flows between the first processing cup and the second processing cup is stored, a first exhaust port that is provided so as to execute exhausting between the first processing cup and the second processing cup, a second exhaust port that is provided so as to execute exhausting on an inner side of the second processing cup, a suction port that is provided between the drain port and the first exhaust port in a height direction thereof, a suction unit that is provided on a suction line that is connected to the suction port, and a controller that controls the suction unit, wherein the controller controls the suction unit so as to execute exhausting from the suction port in a case where the processing liquid flows to an inner side of the second processing cup.

Appendix (10): The substrate processing apparatus according to Appendix (9), including a sealing member that opens or closes the first exhaust port, and a movement device that moves the sealing member, wherein the controller controls the movement device in such a manner that the sealing member closes the first exhaust port in a case where the processing liquid flows to an inner side of the second processing cup.

Appendix (11): The substrate processing apparatus according to Appendix (9) or (10), including a cleaning liquid supply unit that is formed on the first processing cup and supplies a cleaning liquid to an outer wall of the second processing cup, wherein the cleaning liquid supply unit includes a plurality of discharge ports that discharge the cleaning liquid toward an upper end of the second processing cup, and the controller controls the cleaning liquid supply unit in such a manner that the cleaning liquid is discharged in a case where the processing liquid flows between the first processing cup and the second processing cup.

Appendix (12): A substrate processing method, having a first processing step that executes a first process with a first processing liquid for a substrate that is held horizontally by a substrate holding unit, and a second processing step that executes a second process with a second processing liquid for the substrate that is held horizontally by the substrate holding unit, wherein at the second processing step, the second processing liquid that is used for the second process flows between a first processing cup that is provided annularly around the substrate holding unit and a second processing cup that is provided annularly around the substrate holding unit and is provided on an inner side of the first processing cup, and a gas between the first processing cup and the second processing cup is exhausted from a first exhaust port, and at the first processing step, the first processing liquid that is used for the first process flows to an inner side of the second processing cup, a gas on an inner side of the second processing cup is exhausted from a second exhaust port, and a gas between the first processing cup and the second processing cup is exhausted from a suction port that is provided at a height between a drain port that discharges the first processing liquid and the first exhaust port.

Appendix (13): The substrate processing method according to Appendix (12), wherein at the second processing step, the first exhaust port is closed by a sealing member.

Appendix (14): The substrate processing method according to Appendix (12) or (13), wherein at the second processing step, a cleaning liquid is discharged from a cleaning liquid supply unit that is provided on the first processing cup toward an upper end of the second processing cup and an outer wall of the first processing cup is cleaned with the cleaning liquid.

Additionally, it should be considered that an embodiment(s) that is/are disclosed herein is/are not limitative but is/are illustrative in all aspects. In fact, it is possible to implement an embodiment(s) as described above in a wide variety of modes thereof. Furthermore, an embodiment(s) as described above may be omitted, substituted, and/or modified in a variety of modes thereof without departing from an appended claim(s) and an essence thereof.

What is claimed is:

1. A substrate processing apparatus, comprising:
   a substrate holding unit that holds a substrate horizontally;
   a processing liquid supply unit that supplies a processing liquid to the substrate that is held horizontally by the substrate holding unit;
   a first processing cup that is provided annularly around the substrate holding unit;
   a second processing cup that is provided annularly around the substrate holding unit and is provided on an inner side of the first processing cup;
   a drain port that is formed on a storage unit where the processing liquid that flows between the first processing cup and the second processing cup is stored;
   a first exhaust port that is provided to exhaust a gas between the first processing cup and the second processing cup;
   a second exhaust port that is provided on an inner side of the first exhaust port and is provided to exhaust a gas on an inner side of the second processing cup;
   a suction port that is provided between the drain port and the first exhaust port in a height direction thereof; and
   a sealing member that opens or closes the first exhaust port, wherein the sealing member is located between the first processing cup and the second processing cup.

2. The substrate processing apparatus according to claim 1, wherein:
   the first exhaust port is provided below the second processing cup;
   the second processing cup includes;
      the sealing member; and
      a communication port that is communicable with the first exhaust port; and
   the second processing cup is movable between a first position where the sealing member closes the first exhaust port and a second position where the first exhaust port is communicated with the communication port.

3. The substrate processing apparatus according to claim 2, wherein:
   the second processing cup is movable in upward and downward directions; and
   the second processing cup is configured in such a manner that a first processing liquid that is supplied to the substrate flows to an inner side of the second processing cup at the first position and a second processing liquid that is supplied to the substrate flows between the first processing cup and the second processing cup at the second position that is a position below the first position.

4. The substrate processing apparatus according to claim 1, comprising
   a cleaning liquid supply unit that is formed on the first processing cup and supplies a cleaning liquid to an outer wall of the second processing cup, wherein:
   the cleaning liquid supply unit includes a plurality of discharge ports that discharge the cleaning liquid toward an upper end of the second processing cup; and
   the plurality of discharge ports are arranged along a circumferential direction of the first processing cup.

5. The substrate processing apparatus according to claim 1, wherein:
   the first exhaust port and the second exhaust port are commonly connected to an exhaust line; and
   the suction port is connected to a suction line that is different from the exhaust line.

6. The substrate processing apparatus according to claim 1, wherein:
   the storage unit is formed annularly; and
   a plurality of the suction ports are provided along a circumferential direction of the storage unit.

7. A substrate processing apparatus, comprising:

a substrate holding unit that holds a substrate horizontally;

a processing liquid supply unit that supplies a processing liquid to the substrate that is held horizontally by the substrate holding unit;

a first processing cup that is provided annularly around the substrate holding unit;

a second processing cup that is provided annularly around the substrate holding unit and is provided on an inner side of the first processing cup;

a drain port that is formed on a storage unit where the processing liquid that flows between the first processing cup and the second processing cup is stored;

a first exhaust port that is provided to exhaust a gas between the first processing cup and the second processing cup;

a second exhaust port that is provided on an inner side of the first exhaust port and is provided to exhaust a gas on an inner side of the second processing cup; and a suction port that is provided between the drain port and the first exhaust port in a height direction thereof, wherein:

the first exhaust port and the second exhaust port are commonly connected to an exhaust line;

the exhaust line is connected to a plurality of separate exhaust lines through an exhaust switching unit;

the exhaust switching unit includes:
  an external unit that is connected to the exhaust line; and
  an internal unit that is housed in the external unit, and is rotated relative to the external unit to switch a state of communication between the exhaust line and the plurality of separate exhaust lines; and the internal unit includes:
  a plurality of inflow ports that switch a state of communication with the exhaust line depending on a rotational position thereof; and
  a partition wall that partitions an inside of the internal unit into a plurality of chambers that are dependent on the plurality of inflow ports.

8. A substrate processing apparatus, comprising:

a substrate holding unit that holds a substrate horizontally;

a processing liquid supply unit that supplies a processing liquid to the substrate that is held by the substrate holding unit;

a first processing cup that is provided annularly around the substrate holding unit;

a second processing cup that is provided annularly around the substrate holding unit and is provided on an inner side of the first processing cup;

a drain port that is formed on a storage unit where the processing liquid that flows between the first processing cup and the second processing cup is stored;

a first exhaust port that is provided to execute exhausting between the first processing cup and the second processing cup;

a second exhaust port that is provided to execute exhausting on an inner side of the second processing cup;

a suction port that is provided between the drain port and the first exhaust port in a height direction thereof;

a suction unit that is provided on a suction line that is connected to the suction port, and a controller that is configured to control the suction unit to execute exhausting from the suction port in a case where the processing liquid flows to an inner side of the second processing cup.

9. The substrate processing apparatus according to claim 8, comprising:

a sealing member that opens or closes the first exhaust port; and a movement device that moves the sealing member, wherein the controller controls the movement device in such a manner that the sealing member closes the first exhaust port in a case where the processing liquid flows to an inner side of the second processing cup.

10. The substrate processing apparatus according to claim 8, comprising a cleaning liquid supply unit that is formed on the first processing cup and supplies a cleaning liquid to an outer wall of the second processing cup, wherein the cleaning liquid supply unit includes a plurality of discharge ports that discharge the cleaning liquid toward an upper end of the second processing cup, and the controller controls the cleaning liquid supply unit in such a manner that the cleaning liquid is discharged in a case where the processing liquid flows between the first processing cup and the second processing cup.

11. The substrate processing apparatus according to claim 9, comprising a cleaning liquid supply unit that is formed on the first processing cup and supplies a cleaning liquid to an outer wall of the second processing cup, wherein the cleaning liquid supply unit includes a plurality of discharge ports that discharge the cleaning liquid toward an upper end of the second processing cup, and the controller controls the cleaning liquid supply unit in such a manner that the cleaning liquid is discharged in a case where the processing liquid flows between the first processing cup and the second processing cup.

\* \* \* \* \*